(12) United States Patent
Chuang et al.

(10) Patent No.: US 6,210,521 B1
(45) Date of Patent: Apr. 3, 2001

(54) PROCESS AND APPARATUS FOR MAKING RADIALLY ARRANGED ALUMINUM FOIL-FILLED PLASTIC PELLETS TO SHIELD AGAINST ELECTROMAGNETIC INTERFERENCE

(75) Inventors: Tung-Han Chuang; Chin-Ming Chiang, both of Taipei (TW)

(73) Assignee: National Science Council (TW)

( * ) Notice: Subject to any disclaimer, the term of this patent is extended or adjusted under 35 U.S.C. 154(b) by 0 days.

(21) Appl. No.: 09/018,905

(22) Filed: Feb. 5, 1998

(30) Foreign Application Priority Data

Jul. 25, 1997  (TW) ................................. 86110633

(51) Int. Cl.$^7$ .................................................. B32B 31/00
(52) U.S. Cl. ........................................ 156/309.6; 156/269
(58) Field of Search ................... 156/269, 309.6

(56) References Cited

U.S. PATENT DOCUMENTS 4,474,685 * 10/1984 Annis ................................... 428/116
5,531,851    7/1996 Lin et al. ............................... 428/116

FOREIGN PATENT DOCUMENTS 60-112854   6/1985 (JP) .

* cited by examiner

Primary Examiner—Francis J. Lorin
(74) Attorney, Agent, or Firm—Clark & Elbing LLP

(57) ABSTRACT

The present invention provides a novel process for making a radially arranged aluminum foil-filled plastic pellet for shielding against electromagnetic interference, comprising sandwiching a plastic matrix in between two layers of aluminum foil to form an aluminum/plastic/aluminum laminated sheet; slicing the laminated sheet into a plurality of aluminum/plastic/aluminum laminated strips; dividing the plurality of laminated strips into at least one group, each group containing 3 to 20 radially arranged strips; moisturizing and binding at least one group of laminated strips with a molten plastic matrix to form at least one radially arranged aluminum foil-filled plastic bar; and cutting at least one plastic bar into radially arranged aluminum foil-filled plastic pellets. By the present invention, the cost of making the conductive plastic pellets can be decreased, the amount of aluminum foil in the pellet can be greatly increased, and the breakage of the aluminum foil in the die can be prevented.

15 Claims, 4 Drawing Sheets

PROCESS AND APPARATUS FOR MAKING RADIALLY ARRANGED ALUMINUM FOIL-FILLED PLASTIC PELLETS TO SHIELD AGAINST ELECTROMAGNETIC INTERFERENCE

BACKGROUND TO THE INVENTION

1. Field of the Invention

The present invention relates to a novel process for making aluminum foil-filled plastic pellets for shielding against electromagnetic interference (EMI), and more particularly relates to a process for making such pellets which are filled with radially arranged aluminum foil by using two aluminum foil layers and a molten plastic matrix as raw materials.

2. Description of the Prior Art

In recent years, the progress of technology has led to a marked increase in the amount of sophisticated electronic equipment. However, the high-density electromagnetic waves produced from electronic equipment have the potential to damage or adversely affect the performance of other equipment or components. Also, exposure to electromagnetic waves may be harmful to the human body. Therefore, an electrically conductive outer shell is needed to shield against electromagnetic interference (EMI) produced by electronic equipment.

Heretofore, various methods have been used to shield electronic equipment. Metallic boxes and cans fabricated from steel, copper, aluminum, etc., have been used to surround high EMI emitters for the purposes of shielding. However, because shields fabricated from metal are cumbersome, heavy and costly, the electronics industry has resorted to metallized plating on plastics. However, the results obtained with metallic coatings have not always been satisfactory. In addition to being relatively uneconomical, once such metallic coatings are scratched through, they lose part of their shielding effectiveness. Unless such conductive coatings are continuous and free of voids, electromagnetic waves will be free to pass through. Frequently, it is difficult to obtain a dependable, 100% effective coating that is also resistant to peeling.

Further efforts by the electronics industry to develop more dependable light-weight materials for EMI shielding have led to a third approach, namely the use of electrically conductive component-filled plastic composites. It has been anticipated that it will be possible to mold intricate shapes from such composite materials by conventional means, yielding a finished part that promises to be more economical and dependable than metal or metal-coated plastics.

The principal factor influencing the performance of conductive component-filled plastic composites is the aspect ratio of the conductive fillers. The aspect ratio is defined as the ratio of the maximum dimension to the minimum dimension of the filler. For example, the aspect ratio of a fiber is the ratio of the length to the diameter of the fiber. According to electromagnetic wave percolation theory, if the conductive filler in the plastic retains a higher aspect ratio, the filler easily forms a conductive network; thus, the critical concentration of the conductive filler required to achieve the electromagnetic shielding effect (that is, the threshold percolation concentration) is reduced.

There are three types of methods for preparing conductive component-filled plastic composites. The first type involves compounding the conductive fillers in the form of powders, short fibers or flakes with the plastic matrix. Then, the mixture is hot-pressed molded or injection molded into various kinds of plastic products for shielding EMI.

For example, U.S. Pat. No. 4,474,685 discloses a process for fabricating electromagnetic shielding products by first compounding and then moulding a molding composition including a thermosetting resin binder and an electrically conductive filler (including carbon black, graphite and conductive metal powders). However, during the compounding with the resin matrix, the conductive powders may easily cluster, and thus are not capable of dispersing in the resin matrix. Consequently, the electromagnetic shielding effectiveness of the molded products can not be effectively improved. Furthermore, since the powder filler has a lower aspect ratio, according to the electromagnetic wave percolation theory as mentioned above, the amount of powder filler added (i.e., threshold percolation concentration) must be relatively high to achieve electrical conductivity. Consequently, the mechanical properties, color and other physical and chemical properties of the molded products are adversely affected.

Alternatively, if the conductive filler is in a higher aspect ratio form such as fibers or flakes, although the filler can be loaded to a lower level, clustering is still difficult to prevent. In addition, during the compounding process, in order to maintain the original aspect ratio, the conductive filler should be strong enough to prevent brittleness due to compounding. However, such a strong conductive filler is very expensive, and is thus not suitable for ordinary low-cost electronic equipment.

The second type of method for preparing conductive component-filled plastic composites involves binding a plastic layer to enclose the conductive filler by immersion or extrusion, and then cutting the conductive long fiber-filled plastic stick to a predetermined length. For example, Japanese Patent No. 60-112854 discloses a process including continuous extruding thermoplastic plastic to enclose a copper fiber so as to form a copper fiber-filled plastic round stick, and then cutting the plastic round stick into pellets of a predetermined size. In order to increase the aspect ratio of the filler, the diameter of the conductive long fiber should be as small as possible. The fibrous filler must be strong enough to prevent breakage. However, such strong fibrous filler, such as stainless steel fiber, copper fiber or metal-coated carbon fiber, is very expensive.

To decrease the total cost involved in the production of conductive component-filled plastic composites, aluminum filler which has the advantages of low price, low density, excellent electromagnetic shielding effectiveness, and ease of color matching has already been used. When aluminum flakes are applied to the first type of method for preparing aluminum-filled plastic composites, the process involves compounding aluminum flakes with plastic. However, since aluminum has low strength, many aluminum flakes break during the compounding process, resulting in a rapid decrease of the aspect ratio. Therefore, the incorporation amount (threshold percolation concentration) should be increased to a very high level (generally, as high as 30 to 40%) to achieve an acceptable electromagnetic shielding effectiveness. The result is that total costs are increased, and more seriously, the electromagnetic shielding plastic products thus obtained have poor mechanical properties. For example, elongation, tensile strength, bending strength and impact strength are all adversely affected.

When aluminum fiber is applied to the second type of method for preparing aluminum-filled plastic composites, the process involves binding a plastic layer to enclose the aluminum fiber by immersion or extrusion. Again, since the diameter of the aluminum fiber is very small and the aluminum has low strength, the aluminum fibers easily break, resulting in a rapid decrease of the aspect ratio.

In order to solve the above-mentioned problems, one of the inventors of the present invention has disclosed in U.S. Pat. No. 5,531,851 a third type of process for making metallized plastic pellets, in which the radially arranged metal is filled. The process involves sandwiching an electrically conductive metal foil in between two plastic films to form a metallized laminated plastic sheet; slicing the plastic sheet into plastic strips; radially arranging the metallized plastic strips into a die of an extruder to be moisturized and bound by the molten plastic into a metallized plastic bar; and finally cutting the plastic bar into metallized plastic pellets of a predetermined size.

Although this third type of process has seen some improvements over the first and second type processes, still, there are some disadvantages to the third type of process, which are outlined below.

1. First, in the third type of process, two rolls of the already-formed plastic film are used, meaning that higher economic costs are incurred with regard to the raw materials.

2. Second, the plastic/metal/plastic laminated sheet obtained from sandwiching a conductive metal foil in between two plastic films is very thick. Thus, it is very difficult to slice the thick laminated sheet into laminated strips of width 1 to 2 mm, and frequently the result is separation between the plastic films and the metal foil.

3. Since the outer layers of the plastic/metal/plastic laminated strips are plastic, when the strips enter the die of the extruder, they immediately melt; thus, since the plastic layers no longer provide any reinforcement to the metal foil, the metal foil must independently take up the tensile stress in the die to a very large extent. This means that the aluminum foil, with low strength, will break easily, and thus th e whole process is interrupted.

4. In addition, due to the size of the inlet of the die of the extruder, the laminated strips that can enter the die at the same time are limited. Only one layer of aluminum foil is contained in each such plastic/metal/plastic strip. If the strip structure can be altered to increase the number of the metal layers in each plastic/metal/plastic strip, the amount of metal foil in the metallized plastic pellet can be effectively increased.

According to the above descriptions, to date, all three types of process for making aluminum-filled plastic composites suffer from some problems. Since aluminum has low strength, in the first and second types of processes, aluminum flakes and aluminum fibers easily break, resulting in a rapid decrease of the aspect ratio. Therefore, the amount of aluminum incorporated should be increased to a very high level to achieve an acceptable electromagnetic shielding effectiveness. The consequence is that total costs are increased, and more seriously, the electromagnetic shielding plastic products thus obtained have poor mechanical properties.

Although the third type of process has achieved some improvements over the first and second type of processes, it still suffers from some problems, such as higher costs with respect to raw materials, separation of the plastic films from the metal foil, easy breakage of the metal foil, and an inadequate amount of metal foil in one plastic pellet.

SUMMARY OF THE INVENTION

An object of the present invention is to solve the above-mentioned problems and to provide an aluminum-filled plastic composite with a particular structure, which is suitable for use in fabricating, by injection molding, plastic products used to shield against electromagnetic interference.

According to one aspect of the present invention, since the aluminum foil to be filled is not subjected to compounding and is not in the form of a fragile fiber, breakage and clustering do not occur; thus a high aspect ratio of the aluminum can be maintained.

Once the aspect ratio of the aluminum foil is maintained, the aluminum foil can easily form a conductive network; thus the critical incorporation amount of the aluminum filler can be decreased, and adequate electromagnetic shielding effectiveness can be achieved with the provision of less than 10% of aluminum filler. Consequently, the fabrication costs for the plastic products can be reduced, such products are lighter in weight, and the deterioration of the mechanical properties of the products caused by the conductive filler can be alleviated.

According to the second aspect of the present invention, in comparison to the above-mentioned third type of process, the present invention changes the structure of the laminated sheet to a metal/plastic/metal structure, and changes the conventional plastic film raw material to a molten plastic which is directly extruded. By virtue of such modifications, not only can raw material costs be decreased, but also the laminated sheet is thinner, resulting in easier slicing of the laminated sheet and improvements with respect to the separation between the plastic and the metal foil.

Most importantly, according to the third aspect of the present invention, since the outer layers of the laminated strip are aluminum foil, when the laminated strips enter the die of the extrusion machine to be moisturized and bound by the molten plastic matrix, the plastic layers melt slowly. Therefore, most of the time, the plastic layers can provide reinforcement to the metal foil. Thus, although the aluminum foil has low strength, it does not suffer from the problem of breakage in the die.

According to the fourth aspect of the present invention, in comparison to the above-mentioned third type of process, the amount of aluminum foil in the radially arranged aluminum foil-filled plastic pellet of the present invention is two times that of the third type's pellet.

To achieve the above objects, the inventors provide a novel process for making a radially arranged aluminum foil-filled plastic pellet for shielding against electromagnetic interference, comprising the steps of:

(a) sandwiching a plastic matrix in between two layers of aluminum foil to form an aluminum/plastic/aluminum laminated sheet;

(b) slicing the aluminum/plastic/aluminum laminated sheet into a plurality of aluminum/plastic/aluminum laminated strips;

(c) dividing the plurality of laminated strips into at least one group, each group including 3 to 20 radially arranged strips;

(d) moisturizing and binding at least one group of laminated strips with a molten plastic matrix to form at least one radially arranged aluminum foil-filled plastic bar; and (e) cutting at least one radially arranged aluminum foil-filled plastic bar into radially arranged aluminum foil-filled plastic pellets.

Also, a novel apparatus for making a radially arranged aluminum foil-filled plastic pellet for shielding against electromagnetic interference is provided, which comprises:

(a) a means for forming an aluminum/plastic/aluminum laminated sheet;

(b) means for slicing the aluminum/plastic/aluminum laminated sheet into a plurality of aluminum/plastic/aluminum laminated strips, disposed downstream of the forming means;

(c) means for dividing the aluminum/plastic/aluminum laminated strips into at least one group, each group including 3 to 20 radially arranged strips, disposed downstream of the slicing means;

(d) a first die attached to a first extrusion machine, disposed downstream of the dividing means, used for forming at least one radially arranged aluminum foil-filled plastic bar, wherein the first extrusion machine is capable of extruding a molten plastic matrix into the first die, the first die on the side which is adjacent to the dividing means being provided with at least one group of radially arranged inlets, the first die on the side which is apart from the dividing means being provided with at least one exit, wherein the radially arranged inlets in each group are equal in quantity to the quantity of the laminated strips contained in each group divided by the dividing means, and the quantity of the groups of the radially arranged inlets and the quantity of the exits are equal to the quantity of the groups of the laminated strips divided by the dividing means, whereby each group of the laminated strips is capable of going through each group of the radially arranged inlets and entering the first die to be moisturized and bound by the molten plastic matrix received in the first die, and then each group of the moisturized and bound laminated strips are capable of being extruded through each exit into at least one radially arranged aluminum foil-filled plastic bar; and (e) means for cutting at least one radially arranged aluminum foil-filled plastic bar into radially arranged aluminum foil-filled plastic pellets, disposed downstream of the first die.

Further applications of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings, given by way of illustration only and which are not intended to be limitative of the present invention, wherein.

DETAILED DESCRIPTION OF THE PREFERRED EMBODIMENTS

According to the present invention, the process for making a radially arranged aluminum foil-filled plastic pellet for shielding against electromagnetic interference includes the following sequential steps. First, a plastic matrix is sandwiched in between two layers of aluminum foil to form an aluminum/plastic/aluminum laminated sheet. Then, the aluminum/plastic/aluminum laminated sheet is sliced into a plurality of aluminum/plastic/aluminum laminated strips.

Subsequently, the plurality of laminated strips is divided into at least one group. Each group includes 3 to 20 radially arranged strips. Then at least one group of laminated strips are moisturized and bound with a molten plastic matrix to form at least one radially arranged aluminum foil-filled plastic bar.

Finally, at least one radially arranged aluminum foil-filled plastic bar is cut into radially arranged aluminum foil-filled plastic pellets.

In order to sandwich a plastic matrix in between two layers of aluminum foil to form an aluminum/plastic/aluminum laminated sheet, it is preferable to extrude a molten plastic matrix by an extrusion machine between two aluminum foil layers and then hot-press them to bind them into the aluminum/plastic/aluminum laminated sheet.

Figure 1:
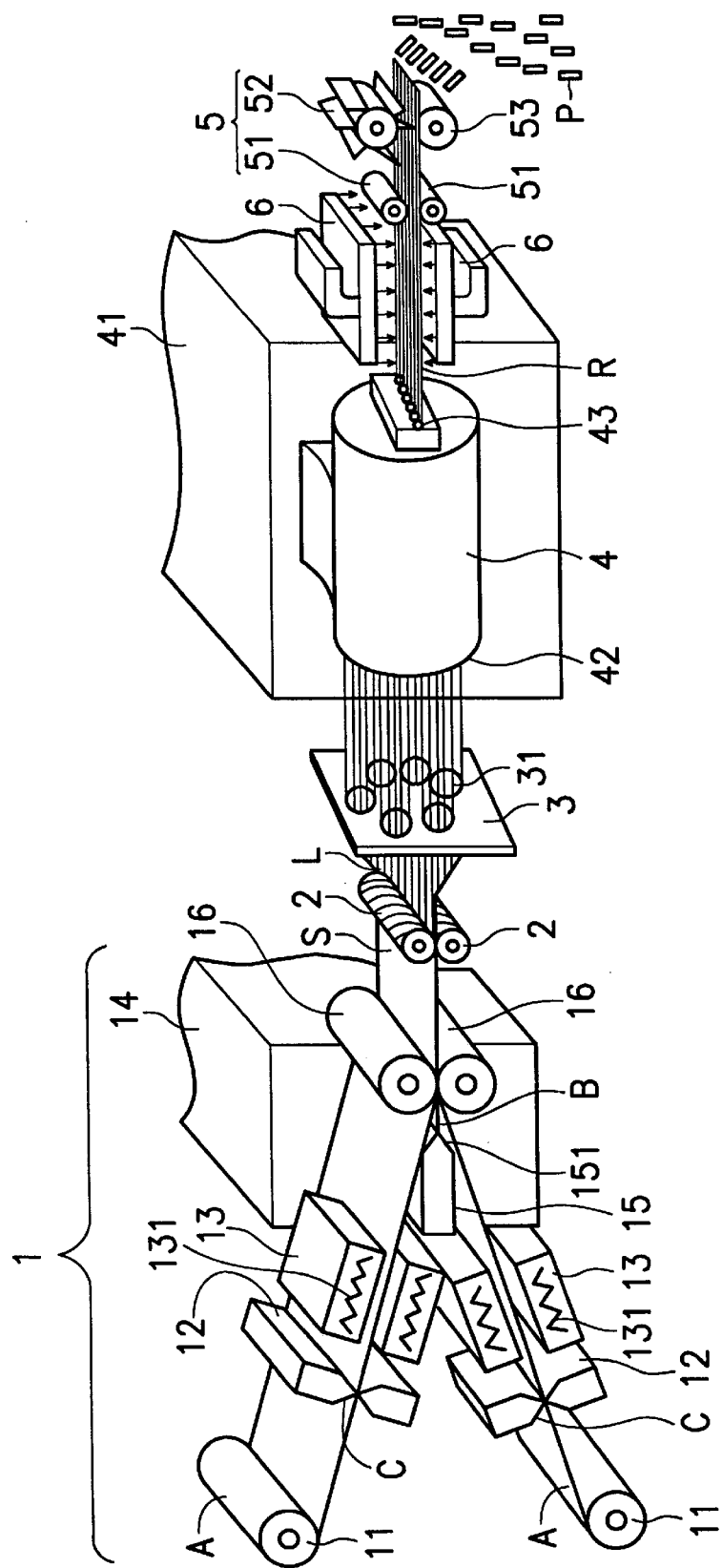
FIG. 1 is a schematic diagram of the apparatus for making radially arranged aluminum foil-filled plastic pellet according to the present invention.

Now referring to FIG. 1, the apparatus for making the radially arranged aluminum foil-filled plastic pellet of the present invention includes, from upstream to downstream, a laminated sheet forming means 1, a slicing means 2, a dividing means 3, a first die 4 attached to a first extrusion machine 41, and a cutting means 5.

The laminated sheet forming means 1 includes, from upstream to downstream, a pair of conveying spools 11, two pairs of spraying devices 12, two pairs of drying devices 13, a second die 15 attached to a second extrusion machine 14, and a pair of rollers 16.

The pair of conveying spools 11 are used for conveying two aluminum foil layers A. Each pair of the spraying devices 12 are disposed adjacent to the upper and lower surfaces of each aluminum foil layer A, such that the upper and lower surfaces of the two aluminum foil layers A can be coated by a coupling agent C sprayed by the spraying devices 12. Each drying means 13 includes fans and electric lines 131 and the drying means 13 is used for drying the coupling agent-sprayed aluminum foil layers A.

Figure 2:
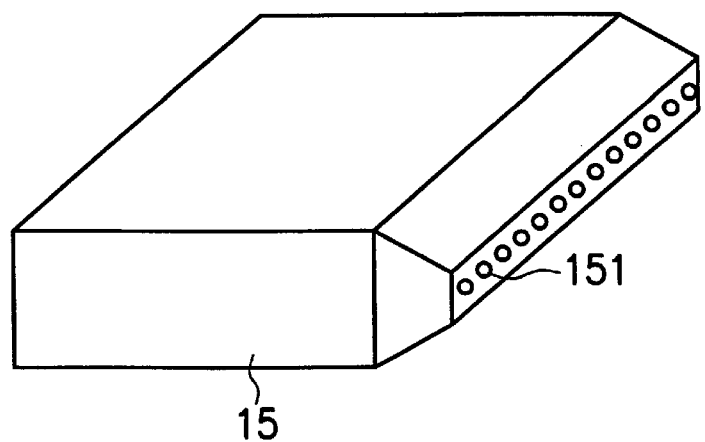
FIG. 2 shows the second die of the second extrusion machine, used for extruding a molten plastic matrix in between two aluminum foil layers.

The second extrusion machine 14 is capable of extruding a molten plastic matrix into the second die 15, and the second die 15 is capable of extruding the molten plastic matrix B into a space between the two aluminum foil layers A through a row of round holes 151 as shown in FIG. 2.

The pair of rollers 16 are used for rolling the two aluminum foil layers A sandwiched with molten plastic B into an aluminum/plastic/aluminum laminated sheet S.

The slicing means 2 is used for slicing the aluminum/plastic/aluminum laminated sheet S into a plurality of aluminum/plastic/aluminum laminated strips L.

The dividing means 3 is used for dividing the aluminum/plastic/aluminum laminated strips L into at least one group, and each group includes 3 to 20 radially arranged strips. The dividing means 3 can be a guiding plate. The guiding plate 3 is provided with at least one guiding hole 31, such that every 3 to 20 laminated strips are capable of going through at least one guiding hole 31. The groups of the laminated strips L are equal in quantity to the quantity of the guiding holes 31. For example, in FIG. 1, the laminated strips L is divided into six groups to go through the six guiding holes 31.

Figure 3:
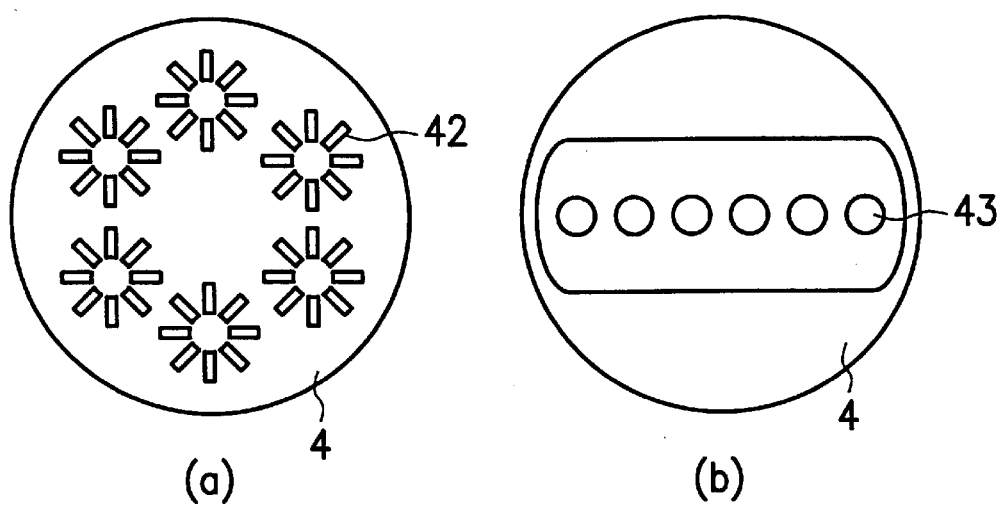
FIG. 3 shows (a) the radially arranged inlets and (b) the outlets of the first die of the first extrusion machine, the second die being used for binding the radially arranged laminated strips.

The first die 4 is attached to the first extrusion machine 41 and is used to form at least one radially arranged aluminum foil-filled plastic bar R. The first extrusion machine 41 is capable of extruding a molten plastic matrix into the first die 4. The first die 4 on its side which is adjacent to the dividing means 3 is provided with at least one group of radially arranged inlets 42 as shown in FIG. 3(a), and the first die 4 on its side which is apart from the dividing means 3 is provided with at least one exit 43 as shown in FIG. 3(b).

The radially arranged inlets 42 in each group are equal in quantity to the quantity of the laminated strips L contained in each group divided by the dividing means 3. Also, the quantity of the groups of the radially arranged inlets 42 and the quantity of the exits 43 are equal to the quantity of the groups of the laminated strips L divided by the dividing means 3. For example, in FIG. 1, the laminated strips L are divided into six groups, the inlets 42 having six groups, and there are six exits on the first die 4. As such, each group of the laminated strips L is capable of going through each group of the radially arranged inlets 42 and entering the first die 4 to be moisturized and bound by the molten plastic matrix received in the first die 4. Then, each group of the moisturized and bound laminated strips are capable of being extruded through each exit 43 into at least one radially arranged aluminum foil-filled plastic bar R. In FIG. 1, six radially arranged aluminum foil-filled plastic bars R can be obtained.

The cutting means 5 is used for cutting at least one radially arranged aluminum foil-filled plastic bar R into radially arranged aluminum foil-filled plastic pellets P. The cutting means 5 includes a pair of introducing rolls 51, a shredding steel roller blade 52, and a roller blade board 53.

A cooling means 6 can be disposed downstream of the first die 4 and upstream of the cutting means 5, which is used for cooling the radially arranged aluminum foil-filled plastic bar R.

Figure 5:
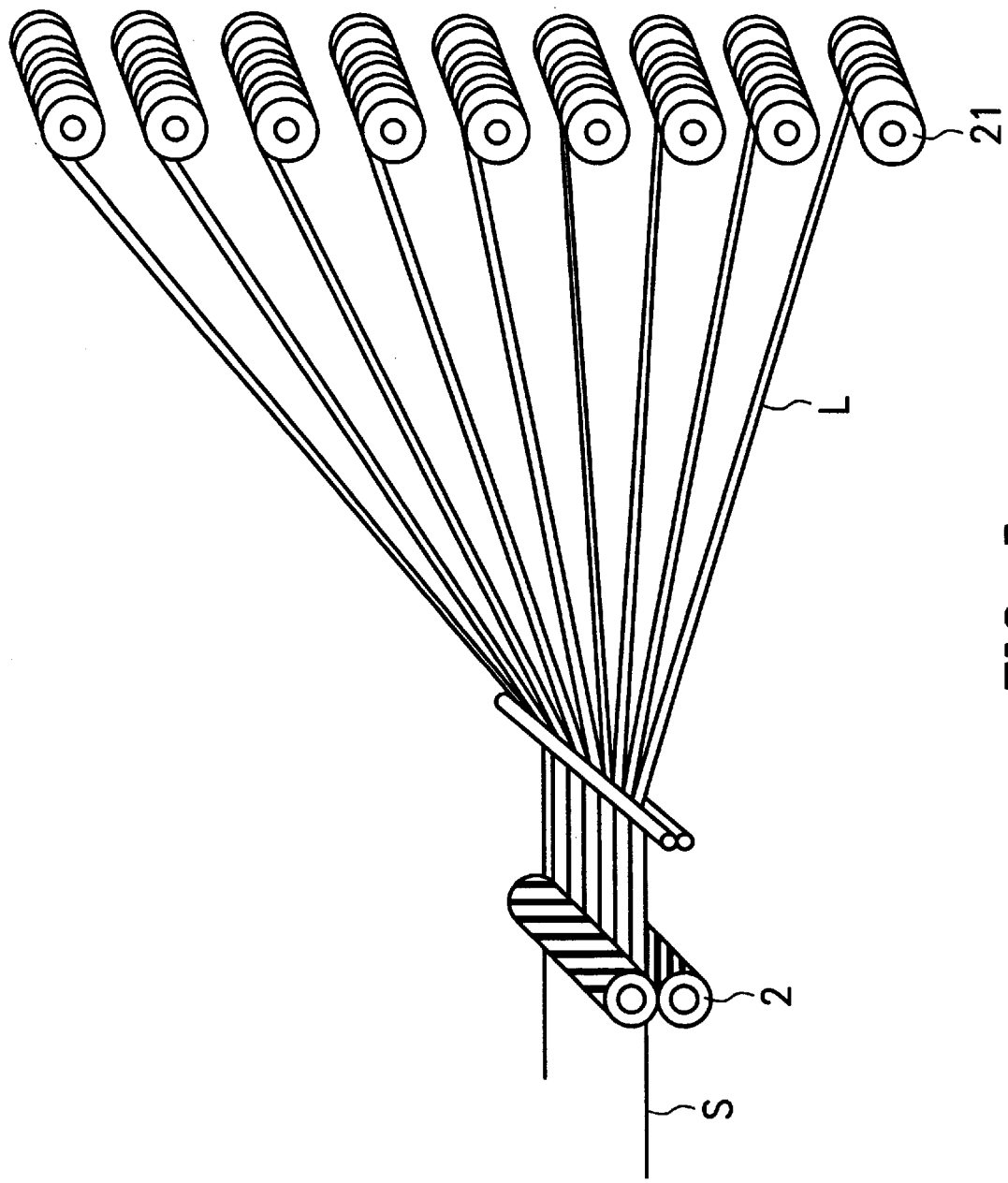
FIG. 5 is a schematic diagram showing the coiling of the aluminum/plastic/aluminum laminated strips according to the present invention.

A coiling means 21 can be disposed downstream of the slicing means 2 and upstream of the dividing means. Referring to FIG. 5, the coiling means 21 is used to coil the plurality of aluminum/plastic/aluminum laminated strips L. As such, the coiled laminated strips can be directly uncoiled and introduced to the guiding plate 3 of the above-mentioned apparatus for making the radially arranged aluminum foil-filled plastic pellets of the present invention. Alternatively, the coiled laminated strips can be used as raw materials for making products for shielding electromagnetic interference by other methods.

In operation, referring to FIG. 1, two rolls of aluminum foil layers A with a thickness of about 0.0065 to 0.02 mm are conveyed by the conveying spools 11. Then, the upper and lower surfaces of the two aluminum foil layers A are coated with a coupling agent C by two pairs of spraying devices 12. Then, the coupling agent-coated aluminum foil layers A are dried with the two pairs of drying devices 13.

The molten plastic matrix is extruded from the second extrusion machine 14 to the second die 15, and then extruded from the second die 15 through a row of round holes 151 (referring to FIG. 2) in between two aluminum foil layers A, such that the molten plastic matrix B is sandwiched in between the two aluminum foil layers A, and then is hot pressed by the pair of rollers 16 into an aluminum/plastic/aluminum laminated sheet S with a thickness of 0.1 to 0.5 mm. The aluminum/plastic/aluminum laminated sheet S is then sliced by the slicing means 2 into a plurality of aluminum/plastic/aluminum laminated strips L with a width of 1 to 2 mm.

The laminated strips L can be coiled by the coiling means 21 (referring to FIG. 5) and can be used as the raw material for making products for shielding electromagnetic interference by a variety of methods. Or, alternatively, the laminated strips L can be coiled and then uncoiled to proceed to the following treatment (that is, to the guiding plate 3). Also, without coiling, the laminated strips L can directly proceed to the guiding plate 3 for further processing.

Referring to FIG. 1, the laminated strips L can then be divided by the guiding plate 3 into a plurality of groups (in the figure, six groups). Each group of strips contains 3 to 20 laminated strips and goes into the first die 4 through each guiding hole 31 and then through each group of radially arranged inlets 42 of the first die 4 (FIG. 3(a)), respectively. In the first die 4, each group of the laminated strips is moisturized and bound by the molten plastic matrix extruded from the first extrusion machine 41.

And finally, each group of the moisturized and bound laminated strips is extruded through each exit 43 provided on the first die 4 (FIG. 3(b)) into a radially arranged aluminum foil-filled plastic round bar R. Each round bar R has a diameter of 3 to 5 mm, and contains 3 to 20 pairs of radially arranged aluminum foil. In FIG. 1, since the laminated strips L are divided by the guiding plate 3 into six groups, therefore six round bars R can be obtained from the first die 4.

The six round radially arranged aluminum foil-filled plastic bars R are cooled by the cooling means 6, introduced by the pair of introducing rolls 51, and finally cut by the shredding steel roller blade 52 and the roller blade board 53 into pellets P with a length of 10 to 15 mm. The metallized pellets filled with radially arranged aluminum foil can be subjected to hot press molding or injection molding to manufacture a variety of plastic articles for shielding electromagnetic interference.

Figure 4:
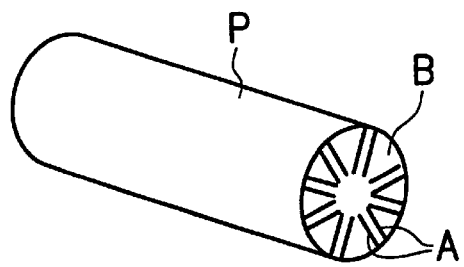
FIG. 4 is a schematic diagram of the radially arranged aluminum foil-filled plastic pellet of the present invention.

Referring to FIGS. 1, 3(a), and 4, each group of the divided laminated strips L contains eight laminated strips and each group of the radially arranged inlets 42 of the first die 4 also has eight inlets. As such, each group of the laminated strips (containing eight strips) enters through each group of the inlets 42 (containing eight inlets), respectively. Therefore, one finally obtained pellet P contains eight pairs of radially arranged aluminum foil.

The aluminum foil used herein is made of pure aluminum or of aluminum alloy. For example, the aluminum foil can be pure aluminum foil for domestic wrapping use, aluminum foil of a higher degree of purity used in industry, or alloyed aluminum foil of higher strength such as 2024 Al—Cu.

The coupling agent suitable for use in the present invention is selected from the group consisting of silanes, titantates, zirconates and aluminates.

The plastic matrix used in the present invention is preferably a thermoplastic so as to maintain it in its molten form. Representative examples of thermoplastics include acrylonitrile-butadiene-styrene (ABS), polystyrene (PS), polyphenylene oxide (PPO) and acrylonitrile-butadiene-styrene/polycarbonate (ABS/PC).

The following examples are intended to illustrate the process and the advantages of the present invention more fully without limiting its scope, since numerous modifications and variations will be apparent to those skilled in the art.

EXAMPLE 1

The metallized pellet of this example was manufactured by using the method and apparatus of the present invention as above-mentioned.

Referring to FIG. 1, two rolls of aluminum foil layers A with a thickness of about 0.0065 mm were conveyed by the conveying spools 11 and coated with Silane A-187 coupling agent (UNION CARBIDE Chemicals and Plastics Co.) diluted with 1 wt. % of alcohol. After being dried with hot air, the two aluminum foil layers A were sandwiched with molten ABS plastic that was extruded from the extrusion machine 14, which was then hot pressed by the pair of rollers 16 into an Al/ABS/Al laminated sheet S with a thickness of 0.2 mm. The Al/ABS/Al laminated sheet S was then sliced by the slicing means 2 into twenty Al/ABS/Al laminated strips L with a width of 1.5 mm.

Then, the 20 laminated strips L were arranged radially and introduced into the 20 radially arranged inlets 42 of the first die 4 respectively. In the first die 4, the 20 laminated strips were moisturized and bound by the molten plastic matrix extruded from the first extrusion machine 41 and were extruded through the exit 43 into a radially arranged aluminum foil-filled plastic round bar R with a diameter of 3 mm. In each metallized plastic round bar, 20 laminated strips are contained, that is to say, 40 aluminum foil strip are contained.

After water cooling, the plastic round bar was cut into radially-arranged aluminum foil-filled plastic pellets with a length of 12 mm. The aluminum content in the pellet is about 12 wt. %.

Figure 6:
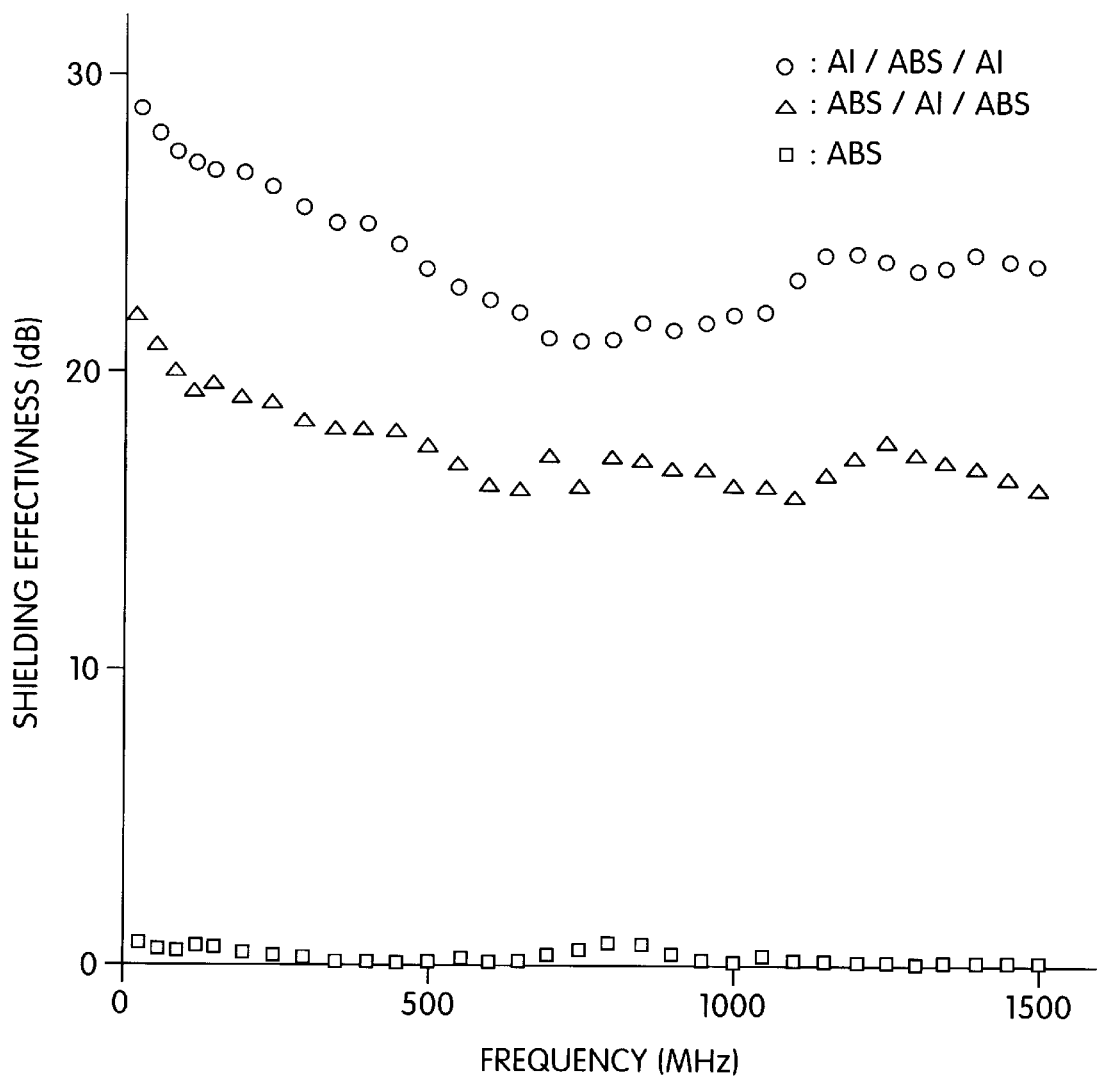
FIG. 6 shows the shielding effectiveness of the plastic pellets obtained from Example 1, and Comparative Examples 1 and 2.

The pellets obtained were manufactured by injection molding into testing specimens for performing test of electromagnetic shielding effectiveness. The conditions for the injection molding were that injection inlet temperature was 220° C., mold temperature was 120° C., injection pressure was 100 kg/cm$^2$. The electromagnetic shielding effectiveness of the specimens in the frequency range between 30 MHz and 1500 MHz were determined according to ASTM D4935-89. The results were shown in FIG. 6 (the curve of Al/ABS/Al).

The results show that the metallized plastic pellets obtained from the present invention have relatively good electromagnetic shielding effectiveness (about 22 dB) in the range of electromagnetic interference frequency of the general computer components (about 450 MHz to 1000 MHz).

COMPARATIVE EXAMPLE 1

The electromagnetic shielding effectiveness of the ABS plastic specimens (without aluminum foil incorporated) was determined. The results are shown in the ABS curve of FIG. 6, indicating that ABS plastic has no electromagnetic shielding effectiveness.

COMPARATIVE EXAMPLE 2

The third type of method for preparing metallized plastic pellets mentioned-above in the specification was conducted for comparison.

According to the method and apparatus of U.S. Pat. No. 5,531,851, an aluminum foil of 0.0065 mm thick was coated with the same coupling agent as used in Example 1, which was then sandwiched between two ABS plastic films of 0.2 mm thick. The aluminum foil-sandwiched ABS plastic was then hot pressed into an ABS/Al/ABS laminated sheet of 0.4 mm thick, which was then cut into laminated strips of 1.5 mm wide.

Since 0.2 mm thickness is the lowest limit for the commercially available ABS plastic. Therefore, the ABS/Al/ABS laminated sheet obtained is at least 0.4 mm thick, which is much thicker than the 0.2 mm thick Al/ABS/Al aminated sheet obtained from Example 1. This makes that aminated sheet obtained from Comparative Example 2 is much difficult to slice than that obtained from Example 1. In addition, the cost of the ABS plastic film is five times that of pure ABS plastic pellets. Therefore, the cost for the raw plastic material of Comparative Example 2 is much more expensive than that of Example 1.

Similar to Example 1, the laminated strips were also arranged radially and introduced into the radially arranged inlets of the die of the extrusion machine to be moisturized and bound by the molten plastic matrix. Then, a radially arranged aluminum foil-filled plastic round bar with a diameter of 3 mm was extruded out, which was cut into radially-arranged aluminum foil-filled plastic pellets.

It should be noted that since the laminated strips obtained is thicker than those obtained from Example 1, it is very difficult for the die to receive the same quantity of strips as in Example 1. Even when the same quantity of strips (twenty) were received in the die and extruded into a round bar, since only 20 aluminum foil strips were contained in one round bar (while 40 aluminum foil strips for Example 1), the aluminum content of the resultant metallized plastic pellet is only 6 wt. %. In addition, when the metallized plastic strips enter the die, the outer plastic layers immediately melt, thus can not provide reinforcement to the aluminum foil.

The advantages of the present invention can be summarized as follows:

1. The plastic raw material of the present invention can be plastic pellets, which are cheaper than the plastic film raw material. Thus, costs involved in the present invention can be decreased.

2. The thickness of the aluminum foil is only 0.0065 to 0.02 mm, which is far smaller than that of the plastic layer. Therefore, the thickness of the aluminum/plastic/aluminum laminated sheet of the present invention is about half that of the plastic/aluminum/plastic laminated sheet used in the conventional process. Thus, the laminated sheet of the present invention can easily be sliced, and the problem of the separation of the aluminum foil from the plastic layer does not occur.

3. Since the laminated strips of the present invention are thinner, when the laminated strips enter the die of the extrusion machine, the die can receive greater quantities of the strips. In addition, each laminated strip contains two aluminum foil layers, which is more than the one aluminum foil layer used in the conventional process for making radially arranged aluminum foil-filled pellet. Therefore, the aluminum foil amount in the finally obtained conductive plastic pellet can be greatly increased.

4. Most importantly, since the outer layers of the aluminum/plastic/aluminum laminated strips of the present invention are aluminum foil, when the laminated strips enter the die of the extruder, the molten plastic matrix in the die first comes into contact with the aluminum foil to moisturize and bind with it, and then the radially arranged aluminum foil-filled plastic round bar is quickly extruded out. With such a quick binding process, the heat of the molten plastic matrix in the die is not completely transferred to the plastic layers of the laminated strips. That is, the plastic layers are not completely melted. Therefore, the plastic layer can provide reinforcement to the aluminum foil and can share the tensile stress taken by the aluminum foil. Thus, breakage of the aluminum foil can be prevented.

5. The aluminum/plastic/aluminum laminated strip of the present invention has adequate strength and good flexibility. Taking an aluminum/plastic/aluminum laminated strip of 0.15 mm in thickness and 1 mm in width as an example, such a strip can take up 700 g of load and still has good flexibility. Therefore, the laminated strips of the present invention can enter the die of the extruder so as to make conductive plastic pellets without breakage. Furthermore, the laminated strips can be easily coiled by the coiling spools and used as the raw materials for the making of conductive plastic products used for shielding against electromagnetic interference and produced by a variety of other methods, such as weaving.

What is claimed is:

1. A process for making a radially arranged aluminum foil-filled plastic pellet for shielding against electromagnetic interference, comprising the steps of:

(a) sandwiching a thermoplastic matrix in between two layers of aluminum foil to form an aluminum/plastic/aluminum laminated sheet by extrusion and hot-pressing means;

(b) slicing the aluminum/plastic/aluminum laminated sheet into a plurality of aluminum/plastic/aluminum laminated strips;

(c) radially arranging the laminated strips and dividing the plurality of laminated strips into at least one group, each group containing 3 to 20 arranged strips;

(d) moisturizing and binding at least one group of laminated strips with a molten thermoplastic matrix to form at least one radially arranged aluminum foil-filled plastic bar; and (e) cutting at least one radially arranged aluminum foil-filled plastic bar into plastic pellets, said pellets containing aluminum foil arranged radially.

2. The process as claimed in claim 1, wherein step (a) comprises:

(a1) coating the upper and lower surfaces of the two aluminum foil layers with a coupling agent by immersion or spraying;

(a2) drying the coupling agent-coated aluminum foil layers; and (a3) sandwiching the plastic matrix in between two aluminum foil layers and hot-pressing to bind them into the aluminum/plastic/aluminum laminated sheet.

3. The process as claimed in claim 2, wherein step (a3) is conducted by extruding a molten plastic matrix by an extrusion machine between two aluminum foil layers and hot-pressing to bind them into the aluminum/plastic/aluminum laminated sheet.

4. The process as claimed in claim 1, wherein after step (d) and before step (e), the aluminum foil-filled plastic bar is cooled.

5. The process as claimed in claim 1, wherein the aluminum foil is made of pure aluminum or aluminum alloy.

6. The process as claimed in claim 1, wherein the plastic matrix is in the form of plastic pellets.

7. The process as claimed in claim 1, wherein the plastic matrix is in the form of a plastic plate.

8. The process as claimed in claim 1, wherein the plastic matrix is a thermoplastic.

9. The process as claimed in claim 8, wherein the thermoplastic is selected from the group consisting of acrylonitrile-butadiene-styrene (ABS), polystyrene (PS), polyphenylene oxide (PPO) and acrylonitrile-butadiene-styrene/polycarbonate (ABS/PC).

10. The process as claimed in claim 2, wherein the coupling agent is selected from the group consisting of silanes, titantates, zirconates and aluminates.

11. The process as claimed in claim 1, wherein the aluminum foil has a thickness of 0.1 to 0.5 mm.

12. The process as claimed in claim 1, wherein the aluminum/plastic/aluminum laminated sheet has a thickness of 0.1 to 0.5 mm.

13. The process as claimed in claim 1, wherein the aluminum/plastic/aluminum laminated sheet has a width of 1 to 2 mm.

14. The process as claimed in claim 1, wherein the radially arranged aluminum foil-filled plastic bar is a round bar.

15. The process as claimed in claim 14, wherein the radially arranged aluminum foil-filled plastic round bar has a diameter of 3 to 5 mm.

* * * * *